United States Patent [19]
Abramian

[11] 4,222,004
[45] Sep. 9, 1980

[54] INDUCTIVE TRANSFORMER-TYPE STORAGE DEVICE

[75] Inventor: Evgeny A. Abramian, Moscow, U.S.S.R.

[73] Assignee: Osoboe Konstruktorskoe Bjuro Instituta Vysokikh Temperatur Akademii Nauk SSSR, Moscow, U.S.S.R.

[21] Appl. No.: 691,437

[22] Filed: Jun. 1, 1976

Related U.S. Application Data

[63] Continuation of Ser. No. 548,734, Feb. 10, 1975, abandoned, which is a continuation of Ser. No. 346,909, Apr. 2, 1973, abandoned.

[30] Foreign Application Priority Data

Apr. 4, 1972 [SU] U.S.S.R. .............................. 1764897

[51] Int. Cl.[2] ...................... H01L 39/04; H02J 15/00
[52] U.S. Cl. .................................. 323/44 F; 336/94; 336/DIG. 1
[58] Field of Search .......................... 174/15 R, 16 R; 307/306; 323/6, 44 F; 336/90, 94, DIG. 1

[56] References Cited

U.S. PATENT DOCUMENTS

| | | | |
|---|---|---|---|
| 2,943,134 | 6/1960 | Liao et al. | 336/94 X |
| 3,028,566 | 4/1962 | Camilli | 174/15 R |
| 3,079,573 | 2/1963 | Smith et al. | 174/16 R |
| 3,158,794 | 11/1964 | Swartz | 336/DIG. 1 |
| 3,360,692 | 12/1967 | Kafka | 323/44 F |
| 3,371,298 | 2/1968 | Narbut | 174/15 R |

*Primary Examiner*—A. D. Pellinen
*Attorney, Agent, or Firm*—Holman & Stern

[57] ABSTRACT

An inductive transformer-type storage device comprising a primary winding and a secondary winding arranged inside the primary winding coaxially thereof. The secondary winding has a substantially greater number of turns than the primary winding and is enclosed in a hermetically sealed casing filled with dielectric having an electric strength of at least 50 kV/cm. The hermetically sealed casing also encloses the gap between the windings, which gap is selected so as to ensure the break-down strength in the dielectric, as well as an interwinding coupling factor of 0.2 to 0.8. The inductive storage device is intended for supplying power to installations generating powerful relativistic electron beams.

1 Claim, 6 Drawing Figures

INDUCTIVE TRANSFORMER-TYPE STORAGE DEVICE

This is a continuation of application Ser. No. 548,734 filed Feb. 10, 1975 which in turn is a continuation of Ser. No. 346,909 filed Apr. 2, 1973, both of which are now abandoned.

BACKGROUND OF THE INVENTION

The present invention relates generally to inductive energy storage devices and more particularly, it relates to inductive transformer-type storage devices intended for supplying power to installations wherein a high pulsed output is required, for example, installations generating powerful relativistic electron beams.

Induction storage devices are known in the art comprising a winding which sets up a magnetic field, a power source for this winding, and a means for breaking the winding circuit.

The maximum voltage in such storage devices is determined first of all by the voltage which can be withstood by the switch breaking the accumulating winding circuit. In the prior art storage devices, this voltage is equal to no more than 50 to 100 kV, and in order to increase the voltage generated by these storage devices to several hundred kilovolts, either totally new switches had to be designed or a plurality of known switches had to be connected in series.

A disadvantage inherent in such storage devices resides in the complexity of generating very high voltages in the order of several hundred kilovolts.

There are also known in the art inductive transformer-type storage devices comprising a primary winding and a secondary winding arranged inside the primary winding coaxially thereof. The secondary winding is used mainly to electrically separate the accumulating winding circuit from the load circuit, i.e. the primary and secondary winding circuits. In the prior art inductive transformer-type storage devices, the interwinding coupling coefficient is close to unity, the insulation between the windings is weak, the number of turns in the secondary winding does not exceed to any appreciable degree the turns in the primary winding, and, consequently, the voltage across the secondary winding cannot be much in excess of that across the primary winding, i.e. it cannot exceed 50–100 kV, which considerably limits the field of application of the prior art energy storage devices and particularly, rules out the possibility of using them for supplying power to installations accelerating electrons to relativistic energies (1 Mev), for testing high-voltage electric equipment, etc.

When the prior art inductive storage devices are used for accelerating electrons to relativistic energies, there must be employed additional means for boosting the voltage generated by these storage devices, for example, a transformer.

Moreover, in the prior art inductive storage devices, the energy takeoff time usually equals $10^{-4}$ to $10^{-2}$ sec, which makes it impossible to use them for supplying power to high-power accelerators with field-emission cathodes wherein the takeoff time should not exceed $10^{-7}$ sec.

SUMMARY OF THE INVENTION

It is therefore an object of the present invention to provide an inductive transformer-type storage device capable of generating high voltages (in the order of several hundred kilovolts) for supplying sufficient power to installations accelerating electrons to relativistic energies without any additional means for boosting this voltage.

Another object of the invention is to provide an inductive transformer-type storage device with an energy takeoff time of about $10^{-7}$ sec.

These and other objects are attained by the provision of an inductive transformer-type storage device comprising a primary winding and a secondary winding arranged inside the primary winding coaxially thereof, the secondary winding has, according to the invention, a substantially greater number of turns than the primary winding and is enclosed in a hermetically sealed casing filled with a dielectric having an electric strength of at least 50 kV/cm, which casing also encloses the gap between the windings, the gap being selected so as to ensure the break-down strength in the dielectric and an interwinding coupling factor within 0.2 to 0.8.

It is desirable to fill the hermetically casing with $SF_6$ under a pressure of 5 to 15 atm.

It is expedient that placed in the casing on the side of the secondary winding high-voltage electrode be a load in the form of a sectioned vacuum tube with its cathode electrically coupled to the high-voltage electrode, and that a space be provided between the secondary winding and the tube sufficiently wide for the magnetic flux enveloped by the secondary winding to pass therethrough.

It is also expedient that in order to reduce the energy takeoff time the high-voltage terminal of the secondary winding be made in the form of a capacitor surface, the other surface being the walls of the casing and the capacitance of the capacitor being so selected as to ensure an energy capacity equal to that of the secondary winding.

Purified water under a pressure of 30 to 100 atm may be used as the insulating medium in the above-mentioned capacitor.

The inductive storage device disclosed herein is capable of generating pulse voltage in the order of 1 MV, which makes it possible to set up momentum of monoenergetic relativistic electrons, as well as to ensure (also in an electron beam) the release of high energies up to 1 MJ within a period of about $10^{-7}$ sec.

BRIEF DESCRIPTION OF THE DRAWINGS

The invention will now be described in greater detail with reference to embodiments thereof taken in conjunction with the accompanying drawings, wherein.

DETAILED DESCRIPTION OF THE PREFERRED EMBODIMENTS

Figure 1:
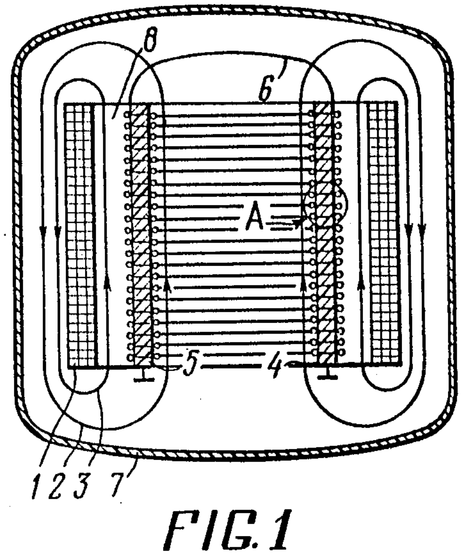
FIG. 1 is a longitudinal section view of an inductive transformer-type storage device, according to the invention.

Referring now to FIG. 1, the inductive storage device comprises a primary winding 1 for setting up magnetic fluxes 2 and 3. A secondary (high-voltage) winding 4 is arranged inside the primary winding 1 coaxially thereof. One terminal 5 of the winding 4 is grounded and the other terminates in a high-voltage electrode 6. Both windings 1 and 4 are enclosed in a hermetically sealed casing or tank 7 filled with a dielectric (not shown) having a dielectric strength of at least 50 kV/cm. The casing 7 may be filled either with $SF_6$ or a mixture of $SF_6$ with nitrogen or freon under a pressure of 5 to 15 atm.

Figure 3:
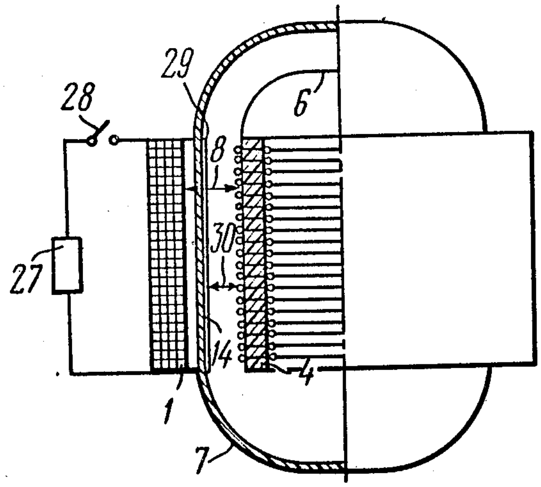
FIG. 3 is a longitudinal section view of a storage device with its primary winding outside the hermetically sealed casing, according to the invention.
Figure 2:
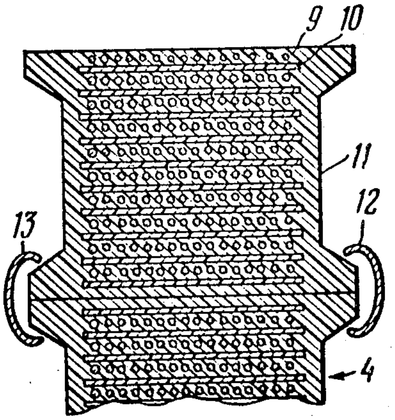
FIG. 2 is enlarged section A of FIG. 1.

A gap 8 is provided between the primary winding 1 and the secondary winding 4 which is selected so as to ensure the breakdown strength in the dielectric filling the casing 7, as well as an interwinding coupling coefficient within 0.2 to 0.8. The number of turns in the secondary winding 4 exceeds that in the primary winding 1 by 10 to 100 times, which ensures a voltage transformation ratio of 100 and more. So, for example, when the voltage across the primary winding is 10 kV, the voltage across the secondary winding may reach as much as 1 MV. The task of ensuring the dielectric strength along the secondary winding 4, the voltage being that high, presents a technical problem, especially in installations wherein the gradient along the winding must be equal to 1 to b 1.5 MV/m. Such gradients may be obtained by making the winding 4 from a plurality of flat layers 9 (FIG. 2). Each layer 9 is a flat spiral, all the spirals being superimposed and connected in series. Interlayer insulation is ensured by seal courses 10. 50 to 100 layers 9 arranged together as shown in FIG. 2 form a coil 11 of the secondary winding. The mechanical and dielectric strength of such coils is ensured by impregnating each coil with an epoxy compound or any other appropriate material in a special device. The dielectric strength of the interlayer and interwinding insulation is also rated at momentary voltage surges occurring in the winding 4 for example in case of accidental break-downs due to high voltage. The coils 11 are interconnected through the medium of metal rings 12 and 13, each ring being azimuthally cut to eliminate shorted turns. Seal courses (not shown) fill the cuts. All the coils 11 are interconnected in series forming the secondary winding 4. The high-voltge electrode 6 is made so as to be transmittant to the rapidly varying (diminishing) magnetic flux 2 at the instant the energy is taken off up from the storge device. It is shaped like a cup and may be made of metal with a multitude of radial slots or of an insulating material with a thin wire wound thereon. Other embodiments are equally possible. The shape of the electrode 6 is selected so as to ensure a minimum electric gradient near its surface. The maximum voltage across the primary winding 1 is not high (for example, 10 kV), that is why it can be arranged in any convenient way. The primary winding 1 should not necessarily be placed in an appropriately insulating medium; it can be arranged outside the casing 7 as is shown in FIG. 3. In this case, the cylindrical portion of the casing 7 passes through the winding 1 close to its inner surface. The casing 7 should be transmittant to the magnetic fluxes 2 and 3 at the instant of energy takeoff from the storage device. The simplest embodiment is when the casing 7 is made of an insulating material such as glass-fiber-resin material.

The winding 1 may be made of an ordinary metal or a metal cooled to low temperatures or a superconducting material. If the winding 1 is made of a metal cooled to low temperatures, it should be provided with thermal insulation because certain dielectrics, particularly $SF_6$, cannot be used at a low temperature. In this case, thermal insulation increases the gap 8 between the windings 1 and 4 and slightly reduces the efficiency of the storage device. By the storage device efficiency is meant the magnetic flux (energy) utilization factor, the magnetic flux being set up by the winding 1. Naturally, at a given voltage (and, consequently, with a given gap 8), increasing the diameter of the windings 1 and 4 results in increased efficiency. Thus, the diameter of the winding 4 being equal to one meter, the gap 8 being 10 to 15 cm wide, and the height of the windings being also equal to one meter, the efficiency of the system, i.e. the ratio between the useful energy (in the flux 2) and the total energy accumulated in the system (in the fluxes 2 and 3), is 60 to 70%. Therewith, if the intensity of the magnetic flux set up the winding 1 equals 40 kgs, the useful energy in the flux 2 is about 7 MJ. It should be noted here that this energy may be called useful only conventionally because in the prior art storage devices as well as in the storage device of the present invention not all of the energy can be transferred to the load (due to a voltage drop at the instant of energy takeoff, various losses and the like).

In real installations which may be created in the nearest future, the voltage across the secondary winding being about 1 MV, the interwinding coupling factor of the energy storage device will range from 0.2 and 0.8. On the one hand, such parameters can be obtained at the present state of the art (or at the state of the art in the nearest future), and, on the other hand, the efficiency of the storage device will be sufficiently high for its being competitive with other sources of a pulse voltage in the order of 1 MV, for example, with high-voltage generators based on capacitors.

Figure 4:
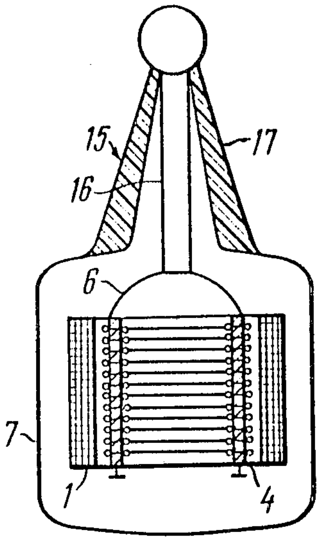
FIG. 4 is a longitudinal section view of a storage device with the high-voltge terminal outside the hermetically sealed casing, according to the invention.

Another embodiment of the inductive storage device as shown in FIG. 4 is provided with a terminal 15 for supplying the high voltage generated by the storage device to a load arranged externally of the casing 7. The terminal 15 consists of a rod 16 disposed inside an insulator 17 designed for the total operation voltage generated by the storage device.

Figure 5:
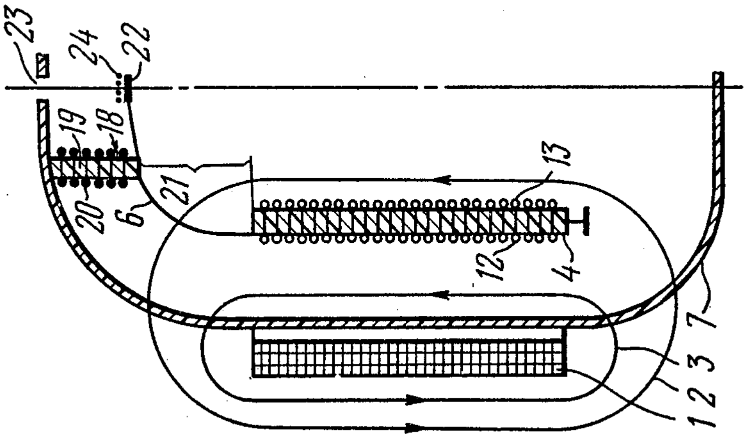
FIG. 5 is a longitudinal section view of a storage device with a load in the form of a sectioned vacuum tube with a cathode, according to the invention.

FIG. 5 shows still another embodiment of the inductive storage device with a load made in the form of a sectioned vacuum tube 18 disposed in the casing 7 together with the winding 4. The tube 18 consists of insulating rings 19 and metal rings 20 pressed against one another so as to ensure a vacuum seal. The tube 18 is provided with ohmic and capacitive voltage dividers (not shown). The tube 18 is separated from the winding 4 by a space 21 to ensure the passage of the magnetic flux 2 therethrough. The size of the space 21 is selected so as not to reduce the interwinding coupling coefficient, i.e. it is sufficient for unhindered passage of the magnetic flux 2 therethrough.

The tube 18 also has a cathode 22 placed on the side of the high-voltage electrode 6 of the winding 4 and electricly connected thereto. The other end of the tube 18 is grounded. The current i of the cathode 22 and the duration $\tau$ of a pulse of the current i are selected so as to ensure the entrainment of a considerable part of the energy of the storage device by a beam: $i\tau v = E$, where v is the voltage across the secondary winding 4 and E is the energy of the flux 2. The voltage across the storage device during a pulse drops and the accelerated beam is not monoenergetic. The accelerated beam can be let out of the storage device through an orifice 23 and used for various purposes. An internal target can be placed inside the tube 18 for decelerating electrons and obtaining gamma radiation. A source of ions can replace the cathode 22 for accelerating the ion beam.

The grid 24 disposed in proximity to the cathode 22 is intended to adjust the beam current. There may be various laws of variation of the beam current with time, particularly a law stipulating that the energy of accelerated electrons remains constant for a certain period of time.

Figure 6:
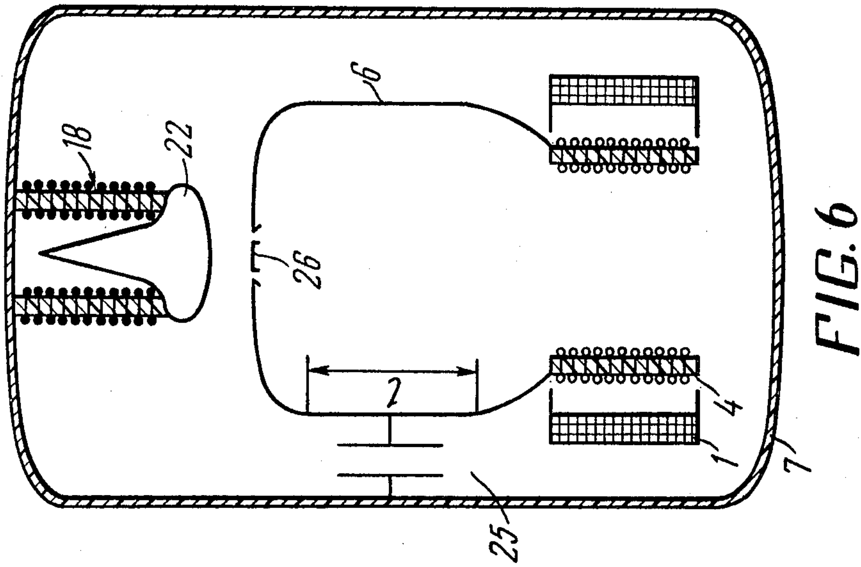
FIG. 6 is a longitudinal section view of a storage device with a capacitor connected to the secondary winding, according to the invention.

Yet another embodiment of the storage device is shown in FIG. 6 with a capacitor 25 connected to the secondary winding 4. The capacitor 25 is formed by the high voltage electrode 6, extended in height as compared to the above embodiments, and the casing 7, and is arranged coaxially. The capacitance of the capacitor 25 is selected so as to make it capable of storing the energy in the magnetic flux $2{:}(cv^2/2)\cong E$. The capacitor 25 is connected to the load as is the sectioned vacuum tube 18 with the cathode 22) via a controlled arrester 26 mounted into the high-voltage electrode 6.

The time $\tau$ of energy takeoff from the capacitor 25 is determined by the length "l" of the capacitor 25 and the dielectric constant of the insulating medium $[\tau-(1/\sqrt{\epsilon})]$, and in the real installations it may be equal to $10^{-7}$ sec. One of the main difficulties in implementing such a system is proper selection of the insulating medium. Using a gaseous medium involves a considerable increase in the size of the capacitor. The energy capacity of a gaseous medium even at an intensity of the electric field of 500 kV/cm is $1.2\cdot10^4$ J/m$^3$, while a magnetic field having an intensity of 40,000 gs provides an energy capacity of $6.4\cdot10^6$ J/m$^3$. The best solution of the problem resides in using dielectrics with high $\epsilon$. So, water, whose $\epsilon=80$, provides for an energy capacity of $10^6$ J/m$^3$, the field intensity being 500 kV/cm. However, at present such field intensities can be obtained in water only for periods of $10^{-5}$ sec and even less. Particularly, a substantial improvement in the dielectric strength of water can be attained when pressure is increased to 30 to 50 atm. The energy takeoff time in a capacitor with water may be very short because of its small size (particularly, due to the length "l" being small) and, consequently, because of high $\epsilon$.

The storage device shown in FIG. 1 and FIG. 3 operates as follows. A d.c. source 27 is connected to the primary winding 1, and, after a certain period of time which is determined by the power of the source and the amount of energy that can be stored by the device, the current through the winding 1 and the intensity of the magnetic field (fluxes 2 and 3) reach maximum values. The value of the maximum possible intensity of the magnetic field in the winding 1, at the present state of the art, may be as high as 30 to 40 thousand gausses, the current intensity being determined by the number of turns and the cross-section of the wire of the winding 1. Once charged, the storage device is considered ready for operation, i.e. for discharging into a preset load. In the case when the primary winding 1 is made of superconducting materials, the source 27 in the primary winding circuit may be de-energized in the absence of an operating pulse, and the turns of the winding may be shorted.

As the circuit of the primary winding 1 is broken with the aid of means 28, for example, a switch, the current therethrough diminishes, and, consequently, so do the magnetic fluxes 2 and 3. A high voltage is induced across the secondary winding 4 which is determined by the ratio between the turns of the windings 1 and 4, as well as by the interwinding coupling coefficient. FIG. 1 shows the state when there is no load and the storage device is under the no-load condition.

The embodiment shown in FIG. 4 is designed to be connected to an external load. In this case, the shape of the voltage across the load is determined both by the parameters of the storage device and those of the load proper.

In the embodiment of FIG. 5, used as the load is an electron beam which appears in the tube 18 as soon as the storage device starts operating in the discharge mode provided there is no cut-off voltage across the grid 24. The grid 24 may be disposed of as well, in which case the tube 18 operates as a diode, the beam current being determined by the voltage across the tube which in turn is determined by the parameters of the storage device, as well as by the surface area and the emissivity of the cathode 22 and other parameters of the tube 18. With the grid 24, a control voltage, preset either by a special program or by a feedback system, may be applied thereto. As has been mentioned above, the voltage across the tube 18 may vary in different ways, which also applies to the energies of the accelerated particles, one of the ways being that this voltage remains invariable for a certain period of time.

In all the embodiments described above, the time during which the storage device discharges into the load is generally preset by the time constant of the circuit "winding 4—load" and in real installations it will be equal to no less than $10^{-3}$ to $10^{-2}$ sec. If the need should arise to discharge the energy stored in the device into the load within $10^{-7}$ sec, the storage device should preferably be embodied according to FIG. 6. The inductance of the winding 4 together with the capacitance C form an LC-circuit; as the circuit of the winding 1 is broken, the magnetic energy from the winding 4 is transferred to the capacitance C, whereafter it may be used, for example, in the accelerating tube 18. Therewith, the time constant of the circuit "capacitor 25—load" is sufficiently low and may be equal to $10^{-7}$ sec.

What is claimed is:

1. An inductive transformer-type storage device for generating voltages on the order of 1 MV and higher comprising a superconductive primary winding;
   - a d-c source for feeding said primary winding;
   - means connecting said primary winding to said d-c source for charging the storage device and storing the accumulated energy and means disconnecting said winding from said source for discharging the storage device;
   - a secondary winding secured coaxially inside said primary winding;
   - said secondary winding having a substantially higher number of turns than said primary winding;
   - a high-voltage electrode of said secondary winding;
   - a gap formed between said primary and secondary windings;
   - a hermetically sealed casing enclosing said secondary winding and said gap;
   - said primary winding being arranged outside said hermetically sealed casing;
   - a dielectric filing said casing and having dielectric strength of at least 50 kV/cm;
   - said gap being selected so as to ensure a breakdown strength in said dielectric and an interwinding coupling coefficient ranging from 0.2 to 0.8.

* * * * *